United States Patent
Masuda

(10) Patent No.: US 7,622,328 B2
(45) Date of Patent: Nov. 24, 2009

(54) PROCESSING METHOD OF WAFER

(75) Inventor: Takatoshi Masuda, Tokyo (JP)

(73) Assignee: Disco Corporation, Tokyo (JP)

( * ) Notice: Subject to any disclaimer, the term of this patent is extended or adjusted under 35 U.S.C. 154(b) by 491 days.

(21) Appl. No.: 11/529,137

(22) Filed: Sep. 28, 2006

(65) Prior Publication Data
US 2007/0077731 A1    Apr. 5, 2007

(30) Foreign Application Priority Data
Sep. 30, 2005   (JP) .............................. 2005-287016

(51) Int. Cl.
*H01L 21/44*    (2006.01)
*H01L 21/48*    (2006.01)
*H01L 21/50*    (2006.01)

(52) U.S. Cl. ............... 438/106; 438/113; 257/E21.237; 257/E21.238; 257/E21.329; 257/E21.499

(58) Field of Classification Search .................... 438/42, 438/106, 110, 118, 113, 459, 460, 462
See application file for complete search history.

(56) References Cited

U.S. PATENT DOCUMENTS

| | | | | |
|---|---|---|---|---|
| 6,581,586 B2 * | 6/2003 | Sekiya | .................... | 125/13.01 |
| 7,384,859 B2 * | 6/2008 | Watanabe | .................... | 438/462 |
| 2007/0134889 A1 * | 6/2007 | Watanabe | .................... | 438/462 |
| 2007/0134890 A1 * | 6/2007 | Watanabe | .................... | 438/462 |
| 2007/0231929 A1 * | 10/2007 | Kajiyama et al. | .............. | 438/6 |
| 2007/0284764 A1 * | 12/2007 | Sekiya | ....................... | 257/797 |

FOREIGN PATENT DOCUMENTS

JP    H05-121384    5/1993

* cited by examiner

*Primary Examiner*—David Nhu
(74) *Attorney, Agent, or Firm*—Brinks Hofer Gilson & Lione

(57) ABSTRACT

A separation groove having a depth corresponding to a finished thickness of a semiconductor chip is formed in a boundary between a device region and an outer peripheral surplus region of a wafer, a protection tape whose adhesion is deteriorated by irradiation of ultraviolet rays is adhered on a surface, a portion of a back surface corresponding to the device region is ground, a thick reinforcing portion is formed on a portion corresponding to the outer peripheral surplus region. Next, only a portion of the protection tape adhered on the reinforcing portion is irradiated with ultraviolet rays, the reinforcing portion 8 is separated from the protection tape and is separated from the device region. A dicing frame is mounted on the back surface of the wafer having only the device region through a dicing tape, and the wafer is divided into semiconductor chips.

2 Claims, 7 Drawing Sheets

Fig. 8
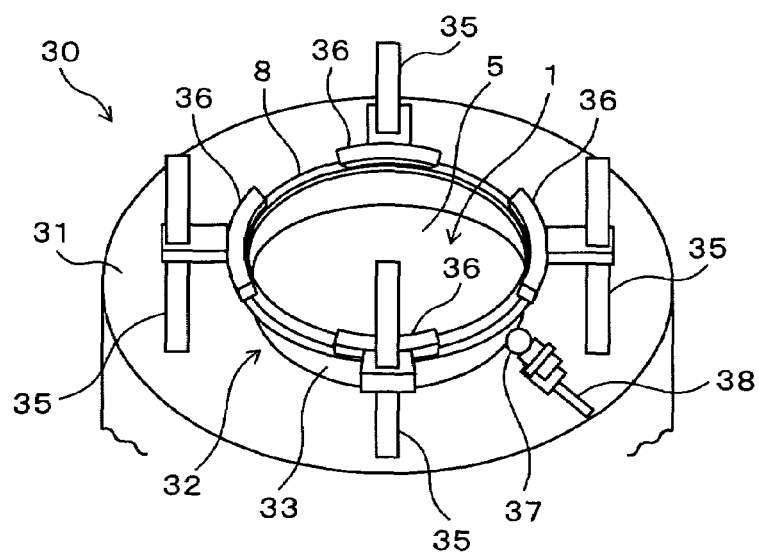
Fig. 9A                    Fig. 9B
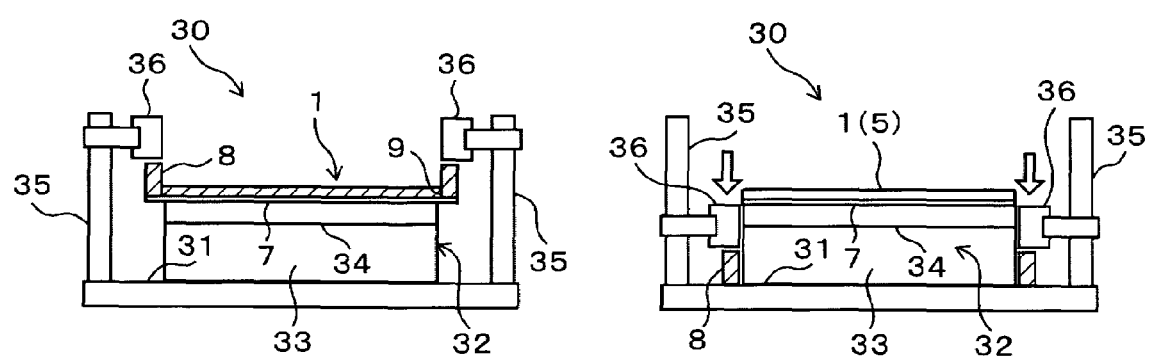

PROCESSING METHOD OF WAFER

This application claims priority under 35 U.S.C. §119 to Japanese Patent Application No. 2005-287016 filed Sep. 30, 2005, the entire content of which is hereby incorporated by reference.

BACKGROUND OF THE INVENTION

1. Field of the Invention

The present invention relates to a processing method of a wafer in which a wafer such as a semiconductor wafer is divided to obtain a plurality of devices, and more particularly, to a processing method in which a wafer has a device region formed with a plurality of devices and an outer peripheral surplus region formed around the device region, and only the device region is thinned and then, the wafer is divided into devices.

2. Description of the Related Arts

Semiconductor chips of devices used for various electronic equipment are produced by a method in which rectangular lattice regions are defined on a surface of a disk-like semiconductor wafer by division lines called streets, electronic circuits are formed on front surfaces of these regions, back surfaces thereof are ground to thin the surfaces, and the wafer is divided along the streets. The slimmed-down tendency of recent years is remarkable and with this tendency, thinner semiconductor chips are required, and this necessitates thinner semiconductor wafers as compared with conventional semiconductor wafers.

If the semiconductor wafer is thinned, however, its rigidity is deteriorated, and there is a problem that it becomes difficult to handle the semiconductor wafer and the semiconductor wafer is easily cracked. Hence, only a circular device region on which the semiconductor chip is formed is ground from its back surface, and its peripheral annular outer peripheral surplus region is formed as a relatively thick reinforcing portion so that the above problem caused by the thinning tendency is not generated. In this case, since the back surface is ground, the thick reinforcing portion projects from the back surface. The technique in which only the outer peripheral portion is thinned is disclosed in Japanese Patent Application Laid-open No. H5-121384 for example.

The semiconductor wafer is finally cut by a cutting apparatus and is divided into semiconductor chips. There is a cutting apparatus of such a type that a semiconductor wafer is absorbed and held on a vacuum chuck type horizontal chuck table, and the semiconductor wafer is cut with a cutting blade from above. The semiconductor wafer is usually supported by a frame mounted on a dicing tape mounted on its back surface, and is held such that its dicing tape side is opposed to the chuck table.

Here, if the semiconductor wafer is a flat plate, its entire back surface comes into intimate contact with the chuck table and thus the back surface is stably held, but if the semiconductor wafer has a thick reinforcing portion projecting toward the back surface of the outer peripheral portion as described above, it is difficult to stably hold the semiconductor wafer. Thus, it is necessary to change the shape of the chuck table such that the chuck table is fitted to the back surface of the concave semiconductor wafer or to grind the reinforcing portion and to form the entire semiconductor wafer into the flat plate shape so that the semiconductor wafer is stably held by the chuck table. However, these methods require much labor and they deteriorate the productivity.

SUMMARY OF THE INVENTION

Hence, it is an object of the present invention to provide a processing method of a wafer in which only a device region surrounded by the outer peripheral surplus region is thinned and then, the device region is divided into a plurality of devices, and the efficienty of this procedure is enhanced, the dividing operation of the devices can be carried out as usual, and increase in cost can be suppressed.

The present invention provides a processing method of a wafer having a device region on which a plurality of devices are defined by division lines on a front surface of the wafer, and an outer peripheral surplus region formed in a periphery of the device, the processing method comprising: a separation groove forming step for forming a separation groove having a depth corresponding to a finished thickness of the device to be obtained after the processing, the separation groove being in a boundary between the device region and the outer peripheral surplus region on the front surface of the wafer; a protection tape adhering step for adhering a protection tape on front surfaces of the device region and the outer peripheral surplus region; a grinding step in which the protection tape is opposed to a chuck table of a grinding apparatus, the wafer is held on the chuck table, a back surface of the wafer corresponding to the device region is ground into a thickness corresponding to the finished thickness of the device, a thick reinforcing portion is formed on a portion corresponding to the outer peripheral surplus region, the reinforcing portion and the device region are connected to each other by the protection tape; a wafer transfer-out step for transfer out the wafer which has been subjected to the grinding step from the chuck table; a device region remaining step for separating the reinforcing portion from the device region so that only the device region remains as the wafer; a dicing frame mounting step for mounting a dicing frame on the back surface of the wafer via a dicing tape; and a dividing step for dividing the wafer supported by the dicing frame into the devices.

According to the invention, in the first separation groove forming step, the separation groove is formed in the boundary between the device region and the outer peripheral surplus region, and only the device region is ground from the back surface and thinned in the grinding step. With this, the thickness of the device region reaches the separation groove, the reinforcing portion and the device region are separated from each other by the separation groove, but they are connected to each other through the protection tape adhered on the surface. By obtaining the wafer in this state, the handling performance and the damage-bearing performance of the wafer up to the dividing step where the wafer is divided into the devices are enhanced.

The reinforcing portion is separated from the wafer and only the device region remains in the device region remaining step. The wafer is divided in the dividing step. Thus, it is possible to hold the wafer on a normal chuck table and to easily carry out the dividing step into the devices. The process from the separation of the reinforcing portion from the device region to the division of the device region into the plurality of devices is efficiently carried out, and since it is easy to divide the wafer into the devices, the increase in cost can be suppressed.

In the present invention, instead of forming the separation groove in the boundary between the device region and the outer peripheral surplus region in the surface of the wafer in the processing method of the wafer, separation grooves are formed in all the division lines to preliminary divide the wafer into the plurality of devices. This is another embodiment. According to this method, if the wafer is subjected to the grinding step in which a portion of the wafer corresponding to the device region is ground from the back surface, the thickness of the thinned device region reaches the separation groove, the device region is separated from the reinforcing portion from the outermost peripheral portion of the division line as a boundary, and the devices in the device region are separated from each other, but since the reinforcing portion, the device region and the devices in the device region are connected to each other through the protection tape adhered on the surface. By obtaining the wafer in this state, the handling performance and the damage-bearing performance of the wafer from the dividing step in which the wafer is divided into the devices are enhanced. Since the devices are divided in this stage, the plurality of devices are picked up from the dicing tape by appropriate means after the dicing frame is mounted on the back surface via the dicing tape.

That is, the other embodiment of the present invention provides a processing method of a wafer having a device region on which a plurality of devices are defined by division lines, and an outer peripheral surplus region formed in a periphery of the device, the processing method comprising: a separation groove forming step for forming a separation groove having a depth corresponding to a finished thickness of the device to be obtained after processing, the separation groove is being formed in the division line on the surface of the wafer, a protection tape adhering step for adhering a protection tape on surfaces of the device region and the outer peripheral surplus region, a grinding step in which the protection tape side is opposed to a chuck table of a grinding apparatus, the wafer is held on the chuck table, a portion of a surface of the wafer exposed in this state corresponding to the device region is ground into a thickness corresponding to a finished thickness of the device, a thick reinforcing portion is formed on a portion corresponding to the outer peripheral surplus region, the reinforcing portion, the device region and the devices in the device region are connected to each other through the protection tape, a wafer transfer-out step for transfer out the wafer which is subjected to the grinding step from the chuck table, a device region remaining step for separating the reinforcing portion from the device region so that only the device region remains on wafer, and a dicing frame mounting step for mounting a dicing frame on a back surface of the wafer through a dicing tape.

According to the invention, the efficiency of the process for obtaining a plurality of devices from a wafer having an outer peripheral surplus region around the device region is enhanced, it is possible to divide the wafer into the devices in the normal manner, and it is possible to prevent costs from increasing.

BRIEF DESCRIPTION OF THE DRAWINGS

FIG. 8 is a perspective view of a wafer processing apparatus used in a device region remaining step;

FIGS. 9A and 9B are side views of separating motion of a reinforcing portion in the device region remaining step;

FIGS. 10A and 10B show a state of irradiation of ultraviolet rays in the device region remaining step, wherein FIG. 10A is a perspective view and FIG. 10B is a side view;

DETAILED DESCRIPTION OF THE PREFERRED EMBODIMENTS

Processing methods of wafers according to first and second embodiments of the present invention will be explained with reference to the drawings.

[1] Processing Method of the First Embodiment

Figure 1:
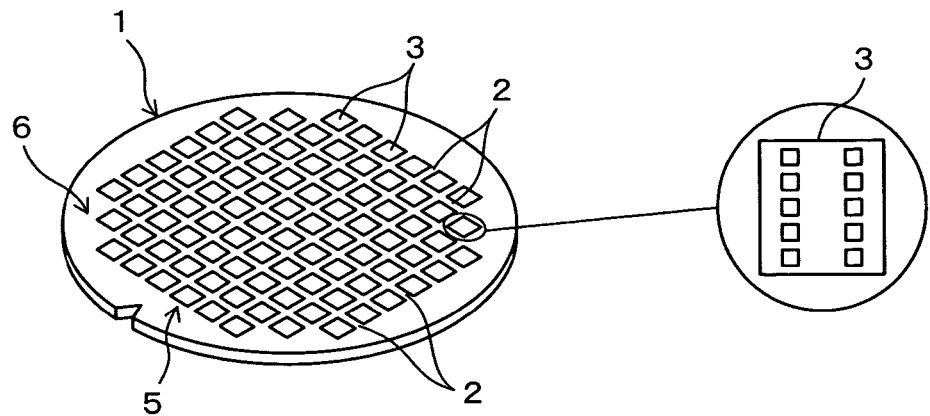
FIG. 1 is a perspective view of entire wafer device into semiconductor chips in an embodiment of the present invention, and an enlarged portion shows a semiconductor chip.

Reference numeral 1 in FIG. 1 shows a disk-like semiconductor wafer (hereinafter referred to simply as "wafer") such a silicon wafer. The thickness of the wafer 1 before it is processed is about 700 μm, and rectangular semiconductor chips 3 are defined by lattice streets 2. Electronic circuits are formed on front surfaces of the semiconductor chips 3. A region where the plurality of semiconductor chips 3 are formed is a substantially circular device region 5 which is coaxial with the wafer 1. An annular outer peripheral surplus region 6 exists around the device region 5.

This embodiment is a method in which a portion of a back surface of the wafer 1 corresponding to the device region 5 is ground, this portion is thinned to a necessary thickness, and respective semiconductor chips 3 are obtained from the thinned device region 5. In the following explanation, the term "front surface" of the wafer 1 is a surface on which electronic circuits are formed, and the term "back surface" is a surface which is opposite from the front surface and on which no electronic circuits are formed.

(1) Separation Groove Forming Step

Figure 2:
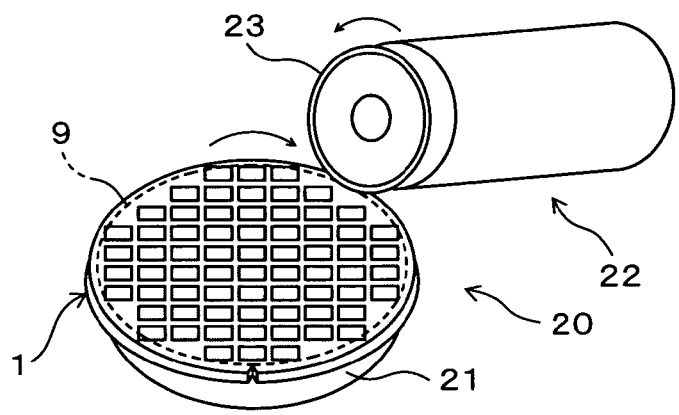
FIG. 2 is a perspective view showing a state in which a separation groove forming step of a first embodiment is carried out by a cutting apparatus.

In this embodiment, before the device region 5 is thinned, a separation groove 9 is formed in a boundary between the device region 5 and the outer peripheral surplus region 6 on the front surface of the wafer 1 by a cutting apparatus 20 shown in FIG. 2. The cutting apparatus 20 includes a vacuum chuck type chuck table 21 which rotates, and a cylindrical cutting unit 22. The cutting unit 22 is disposed such that its axis is oriented horizontally. A cutting blade 23 which is rotated by a motor (not shown) is coaxially mounted on one end of the cutting unit 22.

Figure 3:
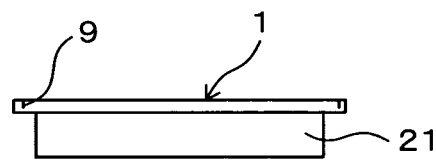
FIG. 3 is a sectional view showing a wafer on a chuck table formed with a separation groove.

The cutting unit 22 is vertically moved such as to cut the wafer 1 held on the chuck table 21. The wafer 1 is held on the chuck table 21 such that a center of the wafer 1 is aligned with a rotation center of the chuck table 21. The rotated cutting blade 23 cut a boundary portion between the device region 5 and the outer peripheral surplus region 6, i.e., an outer peripheral edge of the device region 5 and at the same time, the chuck table 21 is rotated. The cutting depth of the cutting blade 23 is a depth corresponding to a finished thickness (e.g., about 10 to 25 μm) of the semiconductor chip 3, and the cutting depth is equal to the latter depth or slightly deeper than the latter depth. If the chuck table 21 is rotated by one turn, the annular separation groove 9 having the above depth is formed between the device region 5 and the outer peripheral surplus region 6 as shown in FIGS. 2 and 3.

(2) Protection Tape Adhering Step

Figure 4:
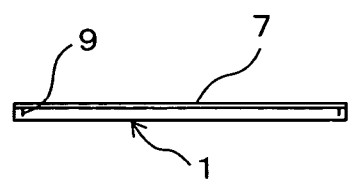
FIG. 4 is a sectional view of the wafer and a protection tape adhered on a surface of the protection tape by a protection tape adhering step.

As shown in FIG. 4, one sheet of circular protection tape 7 is adhered on the entire front surface of the wafer 1, i.e., both surfaces of the device region 5 and the outer peripheral surplus region 6. The protection tape 7 has adhesion which is lowered by irradiation of ultraviolet rays. Acrylic adhesive having a thickness of about 5 to 20 μm is applied to one front surface of a relatively ultraviolet rays hardening type soft polyolefin material having a thickness of about 70 to 200 μm is preferably used as the protection tape 7. The adhesive is adhered on the front surface of the wafer. As the lowering characteristics of the adhesion by the ultraviolet rays irradiation, it is effective if the adhesion before the ultraviolet rays irradiation has about 2.06N/25 mm, and the adhesion after ultraviolet rays irradiation has about 0.05N/25 mm. With this protection tape 7, the electronic circuit of the semiconductor chip is protected.

(3) Grinding Step

Figure 5:
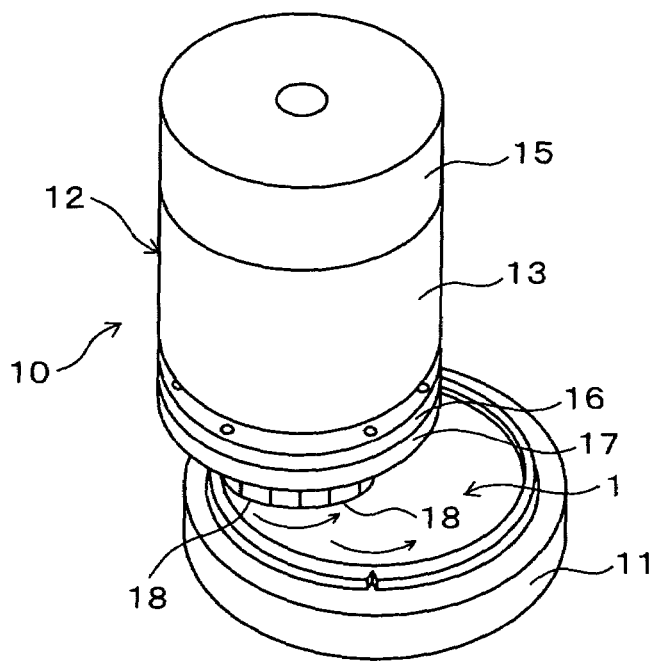
FIG. 5 is a perspective view of a grinding apparatus used in a grinding step.
Figure 6:
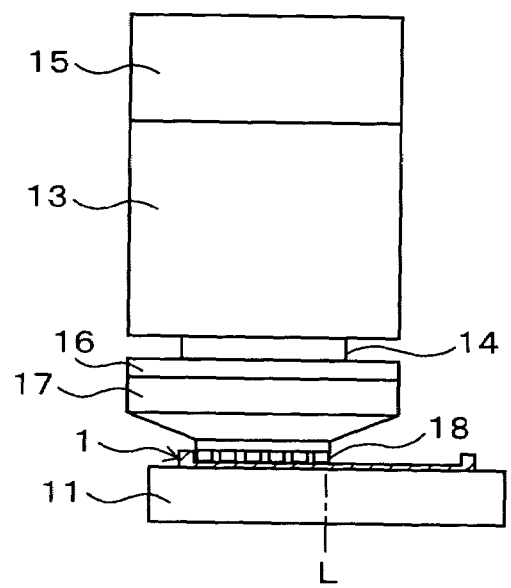
FIG. 6 is a side view of FIG. 5.

The protection tape 7 is adhered on a front surface of the wafer 1. A back surface of the wafer 1 corresponding to the device region 5 is ground, and the device region 5 is thinned to a value the finished thickness. FIGS. 5 and 6 show a grinding apparatus 10 used for the grinding operation. The grinding apparatus 10 includes a vacuum chuck type chuck table 11 which rotates, and a grinding unit 12. The chuck table 11 is of a disk-like shape greater than the wafer 1. The wafer 1 is placed on an upper surface of the chuck table 11 and adsorbs and holds the wafer 1 by air suction. The chuck table 11 is rotated around its center as an axis by a motor (not shown).

According to the grinding unit 12, if a spindle 14 incorporated in a cylindrical housing 13 is rotated by a motor 15, a cup wheel 17 fixed to a tip end of the spindle 14 through a flange 16 is rotated, and a large number of grindstone segments 18 arranged annularly and fixed to the entire circumference of the outer peripheral portion of a lower surface of the cup wheel 17 grind a work piece. The outer diameter of a circular grinding locus of the grindstone segments 18 is substantially equal to a radius of the device region 5 of the wafer 1.

The grinding unit 12 is offset with respect to the chuck table 11. More specifically, as shown in FIG. 6, the relative position is set such that a substantially central portion of a blade thickness (length in the radial direction) of one of the large number of annularly arranged grindstone segments 18 located at the innermost side of the chuck table 11 comes on a vertical line L passing through a center of the chuck table 11.

Figure 7:
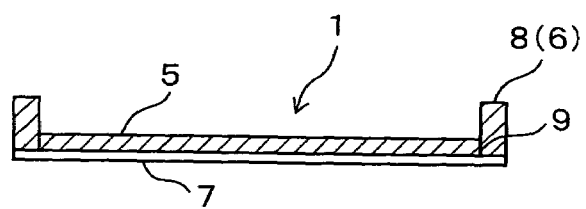
FIG. 7 is a sectional view of a wafer after the grinding step.

The wafer 1 is held on the chuck table 11 such that a side of the wafer 1 closer to the protection tape 7 is opposed to an upper surface of the chuck table 11 and a center of the wafer 1 is aligned with a rotation center of the chuck table 11. The grinding unit 12 is lowered while rotating the cup wheel 17, the grindstone segments 18 is pushed against the entire back surface of the exposed wafer 1, and the chuck table 11 is rotated. With this, a portion of the back surface of the wafer 1 corresponding to the device region 5 is ground and the thickness thereof is reduced to the finished thickness of the semiconductor chip 3. With this, the original thickness remains in a portion of the wafer 1 corresponding to the outer peripheral surplus region 6 around the device region 5 as shown in FIG. 7, and the annular reinforcing portion 8 is formed such as to project from the back surface thereof, the thinning grinding operation reaches the separation groove 9, and the device region 5 and the reinforcing portion 8 are separated. However, the separated device region 5 and the reinforcing portion 8 are connected to each other by the protection tape 7.

The wafer 1 subjected to the above-described grinding step is brought into a next wafer transfer-out step but before that, in some cases, a back surface of the wafer 1 is polished or etched, or a metal thin film is formed on the back surface by vapor deposition or sputtering. In some cases, an adhesive film when the semiconductor chips 3 are laminated and used is adhered on the back surface. When the metal thin film is formed by the vapor deposition or sputtering, a protection tape 7 having heat resistance is used so that the protection tape 7 is not melted during that processing.

(4) Wafer Transfer-out Step

A wafer 1 in a state in which the thinned device region 5 and the reinforcing portion 8 having the original thickness are connected to each other through the protection tape 7 is transferred out from the chuck table 11 of the grinding apparatus 10 and is sent to a next device region remaining step.

(5) Device Region Remaining Step

Figure 10A:
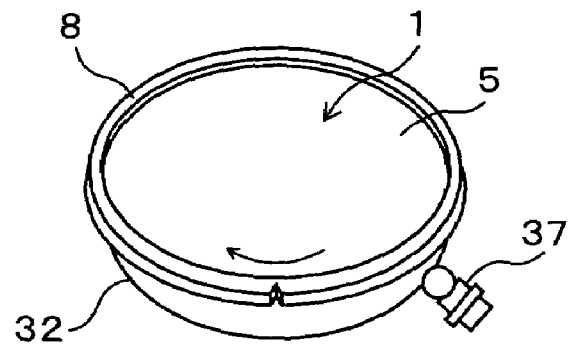
Figure 10B:
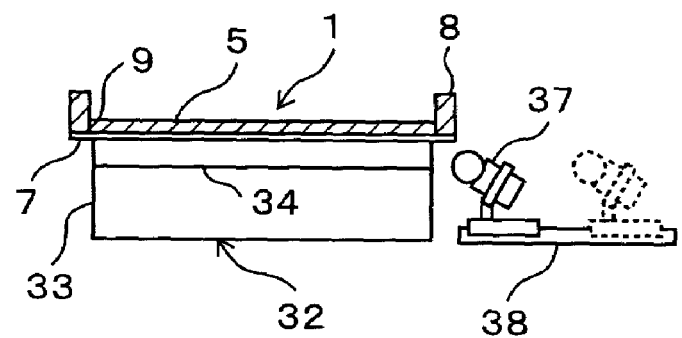

In the device region remaining step, the reinforcing portion 8 is separated from the device region 5 using a wafer processing apparatus 30 shown in FIGS. 8 to 10 so that the device region 5 remains. The wafer processing apparatus 30 includes a base 31 and a mounting table 32 placed on the base 31. The mounting table 32 has a cylindrical stationary stage 33, and a disk-like turntable 34 which is rotated is mounted on an upper portion of the stationary stage 33. A plurality of (four, in the illustrated example) arc pusher pads 36 are disposed around the mounting table 32 along the circumferential direction at equal distances from one another. The pusher pads 36 are vertically moved along a guide post 35 which stands on the base 31. The pusher pads 36 vertically move in a state where the vertical positions of the pusher pads 36 are aligned with each other.

The outer diameter of the stationary stage 33 and the above-described of the turntable 34 of the mounting table 32 are the same, the outer diameters are equal to the diameter of the device region 5 of the wafer 1, and the wafer 1 is coaxially disposed on the turntable 34 such that the wafer 1 is opposed to the protection tape 7. The wafer 1 is transferred to the mounting table 32 by clamping the reinforcing portion 8. In this mounted state, a lower surface of the wafer 1, i.e., the front surface thereof covered with the protection tape 7 is superposed on the upper surface of the turntable 34 and the reinforcing portion 8 protrudes from the turntable 34.

The reinforcing portion 8 protrudes from the turntable 34 in this manner, and the positional relation and shapes are set such that if the pusher pads 36 are lowered from the positions above the guide post 35, the pusher pads 36 abut against the protruding reinforcing portion 8 only. An ultraviolet ray lamp 37 for irradiating ultraviolet rays is disposed on the base 31 for irradiating a lower surface of the reinforcing portion 8 with ultraviolet rays. The irradiating direction of the ultraviolet ray lamp 37 is oriented diagonally upward, and the ultraviolet ray lamp 37 can move toward and away from the stationary stage 33 along a guide rail 38 disposed on the base 31.

To carry out the device region remaining step, all of the pusher pads 36 of the wafer processing apparatus 30 are moved upward and then, the protection tape 7 is opposed to the turntable 34 of the mounting table 32 and the wafer 1 is coaxially disposed. Next, as shown in FIG. 10, the ultraviolet ray lamp 37 moved toward the mounting table 32 irradiates the lower surface of the reinforcing portion 8 with ultraviolet rays and in this state, the turntable 34 is rotated at least by one turn. With this, the entire region of the annular portion of the protection tape 7 adhered on the reinforcing portion 8 is irradiated with ultraviolet rays, the adhesion of the adhered portion is deteriorated, and the protection tape 7 becomes prone to be peeled off from the reinforcing portion 8. If this operation is completed, the ultraviolet ray lamp 37 is retreated, and the turntable 34 is stopped.

In this embodiment, the entire circumference of the reinforcing portion 8 is irradiated with ultraviolet rays by rotating one ultraviolet ray lamp 37 and one turntable 34. Alternatively, the wafer 1 may be fixed to the mounting table 32, the ultraviolet ray lamp 37 may be formed into an annular shape, or a large number of ultraviolet ray lamps 37 may be disposed annularly so that the entire circumference of the reinforcing portion 8 can be irradiated with ultraviolet rays.

Next, as shown in FIGS. 9A and 9B, the pusher pads 36 which are standby above the reinforcing portion 8 are lowered, the reinforcing portion 8 supported by the protection tape 7 as shown in FIG. 9B is pushed down by the pusher pads 36 because the adhesion of the protection tape 7 is deteriorated, and the reinforcing portion 8 is separated from the protection tape 7 and falls on the base 31. That is, the reinforcing portion 8 is separated from the device region 5, and only the device region 5 remains on the mounting table 32. The reinforcing portion 8 which fell on the base 31 is appropriately collected.

(6) Dicing Frame Mounting Step

Figure 11:
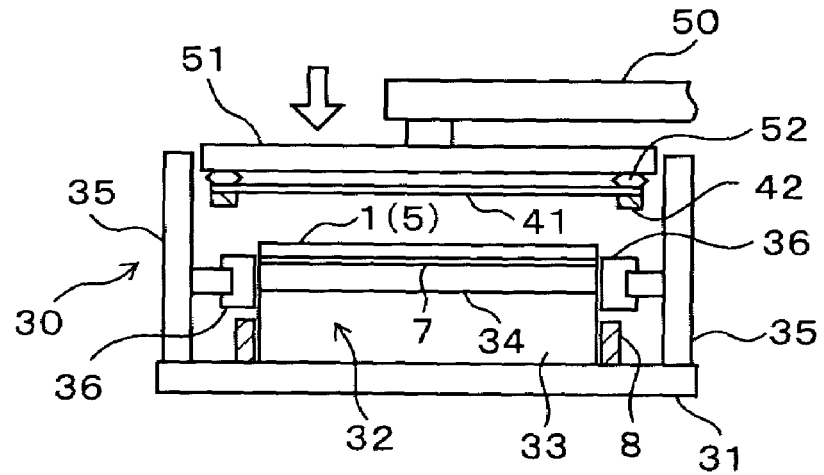
FIG. 11 is a side view showing a state in which a wafer is set on a wafer processing apparatus in a dicing frame mounting step.
Figure 12:
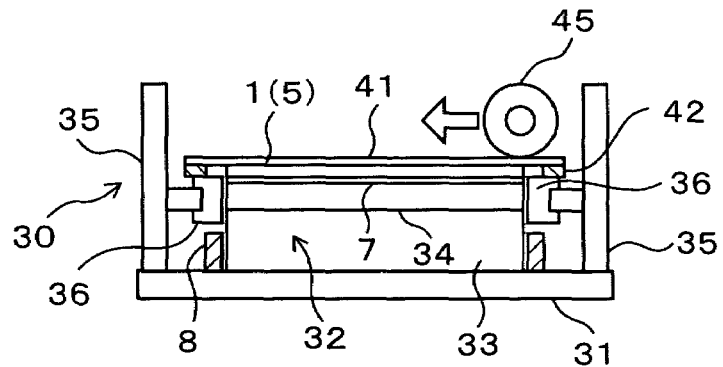
FIG. 12 is a side view showing a state in which a dicing tape is strongly adhered on a wafer by a press roller in a dicing frame mounting step.

In this step, as shown in FIGS. 11 and 12, an annular dicing frame 42 is mounted on an upper surface, i.e., the back surface of the wafer 1 of only device region 5 remaining on the mounting table 32 of the wafer processing apparatus 30 through a dicing tape 41. The dicing tape 41 is made of polyvinyl chloride having a thickness of about 100 μm, and acrylic resin-based adhesive is applied to one side thereof with a thickness of about 5 μm. The dicing tape 41 has a circular shape whose diameter is greater than that of the wafer 1. The annular dicing frame 42 is coaxially adhered on the outer peripheral portion of the dicing tape 41 on the side of the adhesive. The inner diameter of the dicing frame 42 is greater than the diameter of the wafer 1 having only the device region 5.

To mount the dicing frame 42 on the wafer 1, as shown in FIG. 11, a non-adhesive side of the dicing tape 41 on which the dicing frame 42 is not adhered is adsorbed and held by an adsorption pad 52 of a vacuum chuck type chuck portion 51 provided on a tip end of a transfer arm 50. The dicing tape 41 and the dicing frame 42 are transferred to positions directly above the wafer 1 placed on the mounting table 32 of the wafer processing apparatus 30, and they are further lowered, and the dicing tape 41 is coaxially adhered on the upper surface (back surface) of the wafer 1.

Next, as shown in FIG. 12, a press roller 45 has a length longer than a diameter of the wafer 1. The dicing tape 41 is strongly pushed against the entire upper surface of the wafer 1 by the press roller 45 and the adhered state is strengthened. In this state, the pusher pads 36 are lowered to a position where the pusher pads 36 do not interfere with the dicing frame 42.

(7) Dividing Step

Figure 13:
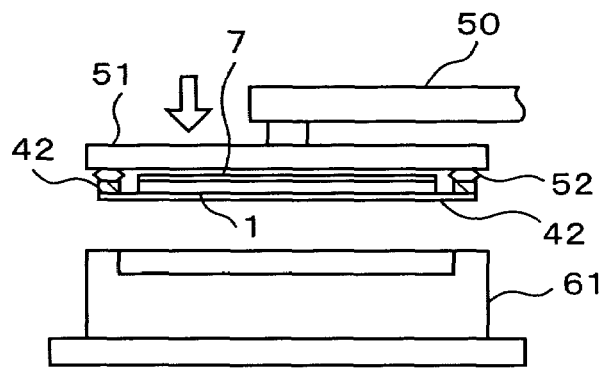
FIG. 13 is a side view showing a state in which a wafer is placed on a chuck table for peeling the protection tape off in a dividing step.

The protection tape 7 is adhered on a lower surface (front surface) of the wafer 1, and the dicing tape 41 is adhered on an upper surface (back surface) of the wafer 1. The wafer 1 is turned over on the mounting table 32 by an appropriate method. As shown in FIG. 13, the dicing frame 42 is adsorbed and held by the adsorption pad 52 of the chuck portion 51 in the transfer arm 50 and the wafer 1 is transferred onto a vacuum chuck type chuck table 61, and the wafer 1 is placed on the chuck table 61 as shown in FIG. 14. The protection tape 7 is adhered on the upper surface of the wafer 1 on the chuck table 61, and the dicing tape 41 is adhered on the lower surface of the wafer 1. The wafer 1 is adsorbed and held on the chuck table 61.

Figure 14A:
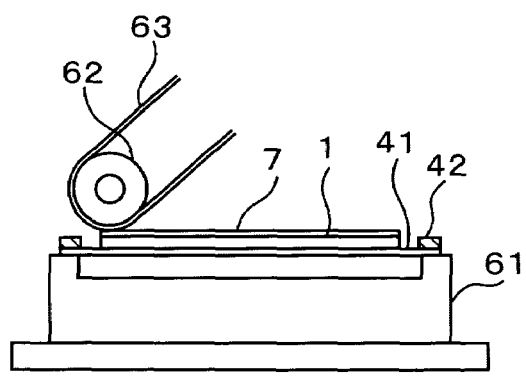
FIGS. 14A and 14B are side views showing a state in which the protection tape is peeled off in the dividing step.
Figure 14B:
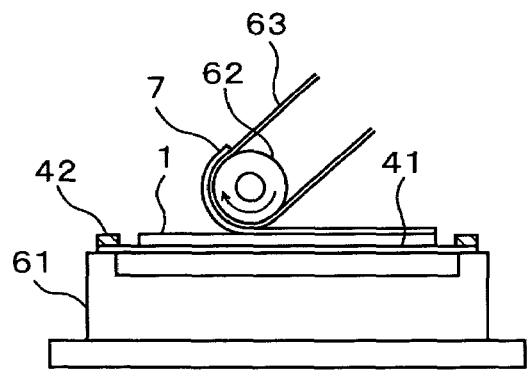

Next, as shown in FIGS. 14A and 14B, a strong adhesive tape 63 wound around a rotation roller 62 is pushed against the outer peripheral portion of the protection tape 7 and rolled toward the inner peripheral side, thereby winding up the protection tape 7 around the strong adhesive tape 63 and is peeled off from the wafer 1. If the protection tape 7 is irradiated with ultraviolet rays to previously deteriorate the adhesion of the protection tape 7 while or after the protection tape 7 is transferred to the chuck table 61, the protection tape 7 can easily be peeled off. Therefore, it is preferable to employ this method.

The wafer 1 from which the protection tape 7 is peeled off is moved to an apparatus which cuts the wafer 1 into the semiconductor chips 3, the apparatus cuts the streets 2 and divides the wafer into the semiconductor chips 3. The cutting apparatus 20 shown in FIG. 2 may also be used as the dividing apparatus and the cutting blade 23 cuts the wafer 1 held on the chuck table 21, or a specially dividing apparatus may be used of course.

According to the embodiment, the separation groove 9 is formed in the boundary between the device region 5 and the outer peripheral surplus region 6 by the first separation groove forming step, and only the device region 5 is ground from the back surface in the grinding step, thereby reducing the thickness of the device region 5. With this, the thickness of the device region 5 reaches the separation groove 9, the reinforcing portion 8 and the device region 5 are separated from each other by the separation groove 9, but they are connected to each other through the protection tape 7 adhered on the front surface. Since the wafer 1 is brought into this state, the handling performance and damage-bearing performance of the wafer 1 up to the dividing step in which the wafer 1 is divided into the semiconductor chips 3 are enhanced.

In the dividing step, the reinforcing portion 8 is separated and the wafer 1 having only the device region 5 is divided. Therefore, the wafer 1 is held on the normal flat plate-like chuck table and the wafer can easily be divided into the semiconductor chips 3. The process from the removal of the reinforcing portion 8 to the division into the semiconductor chips 3 are continuously carried out and thus, the process can be carried out efficiently, and the division into the semiconductor chips 3 can also be carried out as usual and thus, the increase in cost can be suppressed.

Next, a second embodiment of the present invention based on the first embodiment in which the contents of the steps are changed will be explained below.

[2] Processing Method of Second Embodiment

The processing method of the second embodiment is different from the first embodiment in the separation groove forming step which is the first step. The process from the protection tape adhering step to the dicing frame mounting step are the same as those of the first embodiment, but the final dividing step is omitted. Therefore, the separation groove forming step will mainly be explained.

Figure 15:
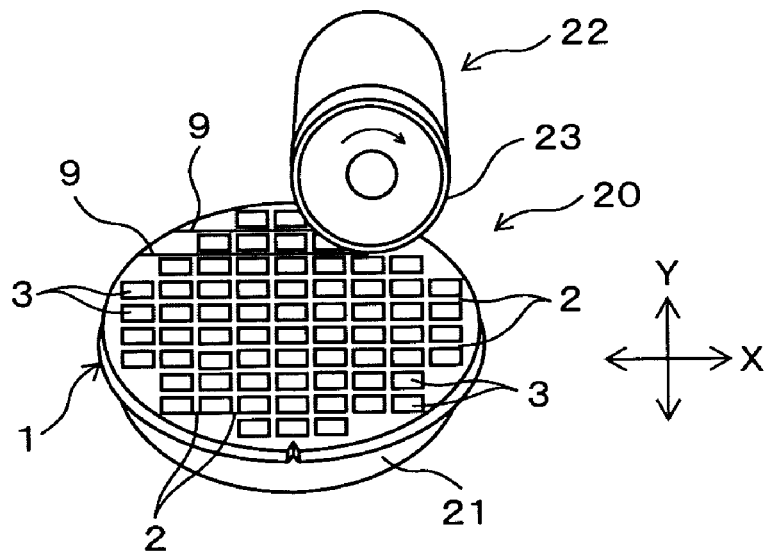
FIG. 15 is a perspective view showing a state in which a separation groove forming step of a second embodiment is carried out by a cutting apparatus.
Figure 16:
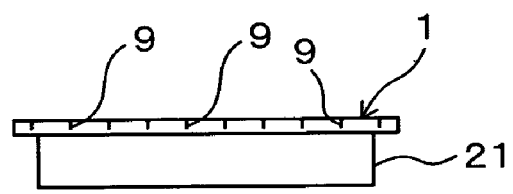
FIG. 16 is a sectional view showing a wafer on the chuck table formed with a separation groove.

In the separation groove forming step, a separation groove 9 is formed in each of the streets 2 of a wafer 1 shown in FIG. 1 before it is processed, and the wafer is previously divided into a plurality of semiconductor chips 3 preliminary. As shown in FIGS. 15 and 16, the cutting blade 23 of the cutting unit 22 cuts the wafer along the street 2 using the cutting apparatus 20 shown in FIG. 2, and the separation groove 9 having a depth corresponding to the finished thickness of the semiconductor chip 3 to be obtained is formed into a lattice shape. The cutting apparatus 20 is provided such that the chuck table and the cutting unit move relatively in the X direction and Y direction in FIG. 15, and the cutting position of the cutting blade 23 is specified by combination of this relative movement and the turning motion of the chuck table 21.

Figure 17:
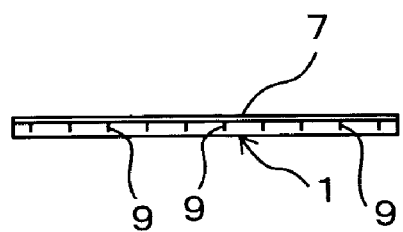
FIG. 17 is a sectional view of a wafer and a protection tape adhered on a surface of the wafer in a protection tape adhering step.
Figure 18:
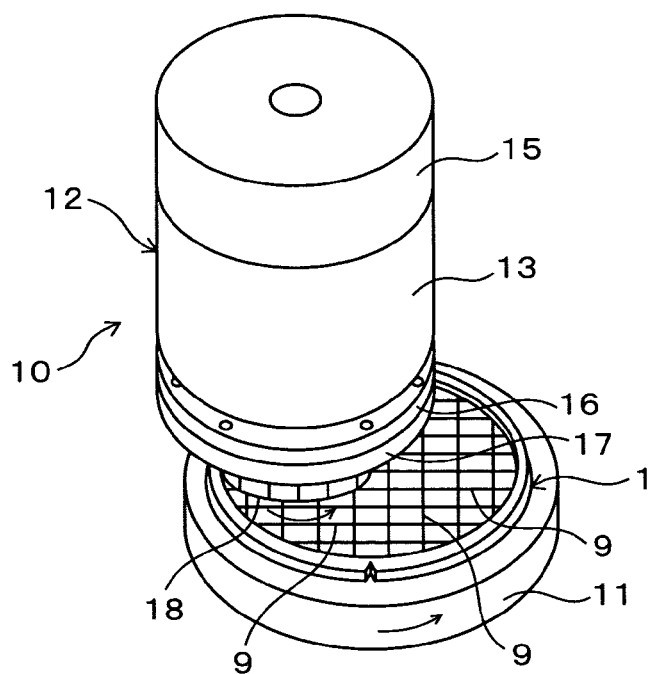
FIG. 18 is a perspective view showing a state in which a grinding step of a second embodiment is carried out.
Figure 19:
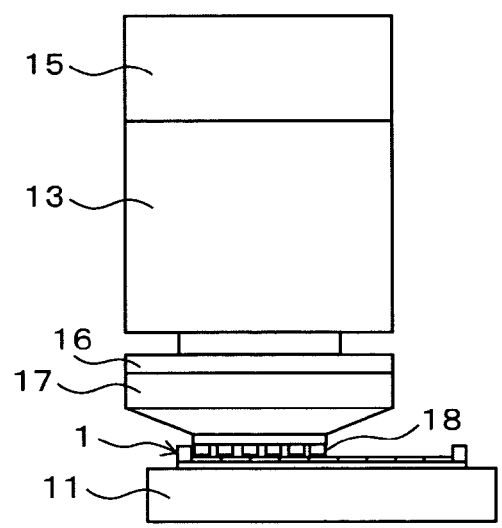
FIG. 19 is a side view of FIG. 18.

In the protection tape adhering step after that, the protection tape 7 is adhered on the front surface on which the separation groove 9 is formed shown in FIG. 17. As shown in FIGS. 18 and 19, the back surface of the device region 5 of the wafer 1 is ground in the grinding step in the same manner as that of the second embodiment, and the outer peripheral surplus region 6 is formed as the reinforcing portion 8.

Figure 20:
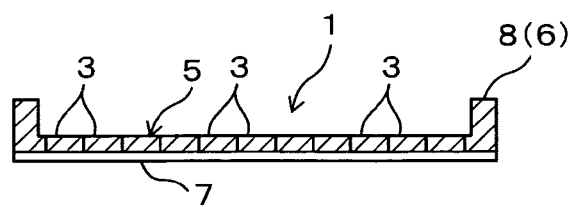
FIG. 20 is a sectional view of a wafer after the grinding step.

With this, the thickness of the thinned device region 5 reaches the separation groove 9. Therefore, the device region 5 is separated from the reinforcing portion 8 from the street 2 of the outermost peripheral portion, and the semiconductor chips 3 in the device region 5 are separated from each other. However, the reinforcing portion 8, the device region 5 and the semiconductor chips 3 in the device region 5 are connected to each other through the protection tape 7 adhered on the front surface (see FIG. 20). Thereafter, the wafer 1 is subjected to the device region remaining step and the dicing frame mounting step and the semiconductor chip 3 is picked up from the dicing tape 41 by appropriate means. According to the second embodiment, only the device region 5 is ground and reduced in thickness, and the semiconductor chips 3 can be obtained at the same time. Unlike the separation groove forming step of the first embodiment, it is unnecessary to form the annular separation groove 9 in the boundary between the device region 5 and the outer peripheral surplus region 6 and thus, there is a merit that the productivity is further enhanced.

In each of the embodiments, adhesion of the protection tape 7 is deteriorated if it is irradiated with ultraviolet rays, the reinforcing portion 8 is separated from the protection tape 7 by irradiation of ultraviolet rays and as a result, the reinforcing portion 8 is separated from the device region 5. However, the technique for separating the reinforcing portion 8 from the device region 5 is not limited to this. For example, a normal adhesive tape (e.g., vinyl chloride is used as base material and adhesive is silicon resin) is used, the protection tape is cut along the boundary between the device region 5 and the reinforcing portion 8 by the device region remaining step, and the reinforcing portion 8 is separated so that only the device region 5 remain.

What is claimed is:

1. A processing method of a wafer having a device region on which a plurality of devices are defined by division lines on a front surface of the wafer, and an outer peripheral surplus region formed in a periphery of the device region, the processing method comprising:

forming a separation groove having a depth corresponding to a finished thickness of the device region to be obtained after the processing, the separation groove being in a boundary between the device region and the outer peripheral surplus region on the front surface of the wafer;

adhering a protection tape on front surfaces of the device region and the outer peripheral surplus region;

grinding the protection tape opposed to a chuck table of a grinding apparatus, the wafer is held on the chuck table, a back surface of the wafer corresponding to the device region is ground into a thickness corresponding to the finished thickness of the device region, a thick reinforcing portion is formed on a portion corresponding to the outer peripheral surplus region, the reinforcing portion and the device region are connected to each other by the protection tape;

transferring out the wafer which has been subjected to the grinding step from the chuck table;

separating the reinforcing portion from the device region so that only the device region remains as the wafer;

mounting a dicing frame on the back surface of the wafer via a dicing tape; and dividing the wafer supported by the dicing frame into the devices.

2. A processing method of a wafer having a device region on which a plurality of devices are defined by division lines on a front surface of the wafer, and an outer peripheral surplus region formed in a periphery of the device region, the processing method comprising:

forming a separation groove having a depth corresponding to a finished thickness of the device region to be obtained after processing, the separation groove is being formed in the division line on the surface of the wafer;

adhering a protection tape on front surfaces of the device region and the outer peripheral surplus region;

grinding the protection tape opposite to a chuck table of a grinding apparatus, the wafer is held on the chuck table, a back surface of the wafer corresponding to the device region is ground into a thickness corresponding to the finished thickness of the device region, a thick reinforcing portion is formed on a portion corresponding to the outer peripheral surplus region, the reinforcing portion, the device region and the devices in the device region are connected to each other via the protection tape;

transferring out the wafer which is subjected to the grinding step from the chuck table;

separating the reinforcing portion from the device region so that only the device region remains as the wafer; and mounting a dicing frame on a back surface of the wafer through a dicing tape.

* * * * *

UNITED STATES PATENT AND TRADEMARK OFFICE
CERTIFICATE OF CORRECTION

| | | |
|---|---|---|
| PATENT NO. | : 7,622,328 B2 | Page 1 of 1 |
| APPLICATION NO. | : 11/529137 | |
| DATED | : November 24, 2009 | |
| INVENTOR(S) | : Takatoshi Masuda | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 548 days.

Signed and Sealed this

Twenty-sixth Day of October, 2010

David J. Kappos
*Director of the United States Patent and Trademark Office*